(12) United States Patent
Yoshimasu et al.

(10) Patent No.: US 11,043,919 B2
(45) Date of Patent: Jun. 22, 2021

(54) POWER AMPLIFIER

(71) Applicant: SAMSUNG ELECTRONICS CO., LTD., Suwon-si (KR)

(72) Inventors: Toshihiko Yoshimasu, Tokyo (JP); Tadamasa Murakami, Yokohama (JP); Tsuyoshi Sugiura, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 53 days.

(21) Appl. No.: 16/522,866

(22) Filed: Jul. 26, 2019

(65) Prior Publication Data
US 2020/0036340 A1 Jan. 30, 2020

(30) Foreign Application Priority Data

Jul. 26, 2018 (JP) .................................. 2018-140536
Apr. 24, 2019 (KR) ........................ 10-2019-0047706

(51) Int. Cl.
| | |
|---|---|
| *H03F 1/02* | (2006.01) |
| *H03F 3/19* | (2006.01) |
| *H03F 3/21* | (2006.01) |
| *G05F 1/565* | (2006.01) |

(52) U.S. Cl.
CPC ........... *H03F 1/0261* (2013.01); *G05F 1/565* (2013.01); *H03F 3/19* (2013.01); *H03F 3/21* (2013.01)

(58) Field of Classification Search
CPC . H03F 1/0261; H03F 3/21; H03F 3/19; G05F 1/565
USPC ................................................. 330/285, 296
See application file for complete search history.

(56) References Cited

U.S. PATENT DOCUMENTS

| | | | |
|---|---|---|---|
| 6,359,516 | B1 | 3/2002 | Luo et al. |
| 6,373,339 | B2 | 4/2002 | Antognetti et al. |
| 6,486,739 | B1 * | 11/2002 | Luo ......................... H03F 1/302 |
| | | | 323/315 |
| 7,139,538 | B2 | 11/2006 | Ono et al. |
| 2017/0294880 | A1 | 10/2017 | Gerard et al. |
| 2018/0026000 | A1 | 1/2018 | De Boet et al. |

FOREIGN PATENT DOCUMENTS

| | | |
|---|---|---|
| EP | 2 482 450 A2 | 1/2012 |
| JP | 2004-505482 A | 2/2004 |
| JP | 2004-193846 A | 7/2004 |
| JP | 2006-511990 A | 4/2006 |

(Continued)

*Primary Examiner* — Hieu P Nguyen
(74) *Attorney, Agent, or Firm* — NSIP Law

(57) ABSTRACT

A power amplifier includes a first bias circuit including a first and third transistor, a first sub-bias circuit, and an amplifying circuit including a fourth transistor. In the first bias circuit, a second terminal of the first transistor and a second terminal of the first sub-bias circuit are grounded, a control terminal of the first transistor is connected to a control terminal of the first sub-bias circuit, a first terminal of the first sub-bias circuit is connected to a constant voltage terminal, a first terminal of the first transistor is connected to a second terminal of the third transistor, a first terminal of the third transistor is connected to a control terminal of the third transistor. The amplifying circuit amplifies an input signal power based on a first bias signal from the first bias circuit to a control terminal of the fourth transistor.

22 Claims, 9 Drawing Sheets

(56) References Cited

FOREIGN PATENT DOCUMENTS

| | | |
|---|---|---|
| JP | 3904817 B2 | 4/2007 |
| JP | 2009-296337 A | 12/2009 |
| JP | 2010-41233 A | 2/2010 |
| JP | 2011-234112 A | 11/2011 |
| JP | 2016-105582 A | 6/2016 |
| JP | 2017-5640 A | 1/2017 |
| JP | 6187444 B2 | 8/2017 |
| KR | 10-2006-0122492 A | 11/2006 |

* cited by examiner

POWER AMPLIFIER

CROSS-REFERENCE TO RELATED APPLICATIONS

This application claims the benefit under 35 USC § 119(a) of Japanese Patent Application No. JP-P-2018-140536 filed on Jul. 26, 2018 in the Japanese Patent Office, and Korean Patent Application No. 10-2019-0047706 filed on Apr. 24, 2019 in the Korean Intellectual Property Office, the entire disclosures of which are incorporated herein by reference for all purposes.

BACKGROUND

1. Field

The following description relates to a power amplifier.

2. Description of Related Art

A power amplifier (PA) is a circuit that sends power to a transmitting antenna in a wireless system such as a wireless communication and a radar, and is a circuit that uses a large amount of power. Accordingly, it is always beneficial to improve the power efficiency of power amplifiers. High linearity may also be beneficial so that transmitted signals are not distorted. In addition, the power amplifier may be implemented by a field effect transistor (FET), particularly, a complementary metal-oxide-semiconductor (CMOS) which may be integrated with another circuit in an inexpensive wireless system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power amplifier includes a first bias circuit includes a first transistor, a third transistor, and a first sub-bias circuit; and an amplifying circuit including a fourth transistor, wherein, in the first bias circuit, a second terminal of the first transistor and a second terminal of the first sub-bias circuit are grounded, a control terminal of the first transistor is connected to a control terminal of the first sub-bias circuit, a first terminal of the first sub-bias circuit is connected to a constant voltage terminal, a first terminal of the first transistor is connected to a second terminal of the third transistor, a first terminal of the third transistor is connected to a control terminal of the third transistor, and the first terminal of the third transistor is connected to the constant voltage terminal, and wherein the amplifying circuit is configured to amplify an input signal power based on a first bias signal supplied from the first bias circuit to a control terminal of the fourth transistor.

The first transistor may have a same polarity as the third transistor, and the fourth transistor may have a same polarity as the first transistor and the third transistor.

The first bias circuit may output a bias signal from the first terminal of the first transistor, and in the amplifying circuit, the control terminal of the fourth transistor may be connected to the first terminal of the first transistor.

The first sub-bias circuit includes a second transistor comprising a first terminal and a second terminal, and a first resistance element comprising a first terminal and a second terminal, the first terminal of the first sub-bias circuit is comprised includes the second terminal of the first resistance element, and the second terminal of the first sub-bias circuit includes the second terminal of the second transistor.

A control terminal of the second transistor may be connected to the first terminal of the second transistor, the first terminal of the second transistor may be connected to the first terminal of the first resistance element, and the second terminal of the first resistance element may be connected to the constant voltage terminal.

The first terminal of the third transistor and the control terminal of the third transistor may be connected via a second resistance element.

The first bias circuit may further include a low-pass filter, the first terminal of the third transistor may be connected to an input terminal of the low-pass filter, and an output terminal of the low-pass filter is connected to the control terminal of the third transistor.

The low-pass filter includes a second resistance element and a capacitor, a first end of the capacitor may be connected to the output terminal of the low-pass filter, and a second end of the capacitor may be grounded.

The first terminal of the third transistor and the input terminal of the low-pass filter may be connected to the constant voltage terminal via a third resistance element.

The first terminal of the first transistor may be connected to a control terminal of the fourth transistor via a fourth resistance element.

The power amplifier may further include a second bias circuit including a fifth transistor and a sixth transistor, each of the fifth transistor and the sixth transistor having a different polarity from the polarity of the first transistor and the polarity of the third transistor; and a second sub-bias circuit, wherein the amplifying circuit further includes an eighth transistor connected in series with the fourth transistor, the eighth transistor having which has the same polarity as the fourth transistor, and the eighth transistor is configured to receive a second bias signal from the fifth transistor.

In the amplifying circuit, a second terminal of the eighth transistor may be connected to a first terminal of the fourth transistor, wherein, in the second bias circuit, a first terminal of the second sub-bias circuit and a first terminal of the sixth transistor are connected to a second constant voltage terminal, a control terminal of the sixth transistor is connected to a control terminal of the second sub-bias circuit, a second terminal of the second sub-bias circuit is grounded, a second terminal of the fifth transistor is grounded, the first terminal of the first transistor is connected to a control terminal of the fifth transistor, and the second terminal of the sixth transistor is connected to a first terminal of the fifth transistor, and wherein the second bias circuit is configured to output the second bias signal from the first terminal of the fifth transistor to a control terminal of the eighth transistor.

The second sub-bias circuit includes a seventh transistor and a sixth resistance element, the first terminal of the second sub-bias circuit includes a first terminal of the seventh transistor, the second terminal of the second sub-bias circuit is comprised of a second terminal of the sixth resistance element, a control terminal of the seventh transistor is connected to a second terminal of the seventh transistor, and the second terminal of the seventh transistor is connected to a first terminal of the sixth resistance element.

The first terminal of the first transistor may be connected to the control terminal of the fifth transistor via a fifth resistance element.

The second bias circuit further includes a ninth transistor which has a same polarity as the fifth transistor and a same polarity as the sixth transistor, and the amplifying circuit further includes a tenth transistor connected in series with the eight transistor, the tenth transistor having a same polarity as the eighth transistor, and the tenth transistor is configured to receive a third bias signal from the ninth transistor.

In the amplifying circuit, a second terminal of the tenth transistor may be connected in series with a first terminal of the eighth transistor, in the second bias circuit, a second terminal of the sixth transistor may be connected to a first terminal of the ninth transistor, a control terminal of the ninth transistor may be connected to a second terminal of the ninth transistor, the second terminal of the ninth transistor may be connected to a first terminal of the fifth transistor, and the second bias circuit may be configured to output the third bias signal from the first terminal of the ninth transistor to a control terminal of the tenth transistor.

Other features and aspects will be apparent from the following detailed description, the drawings, and the claims.

Figure 1:
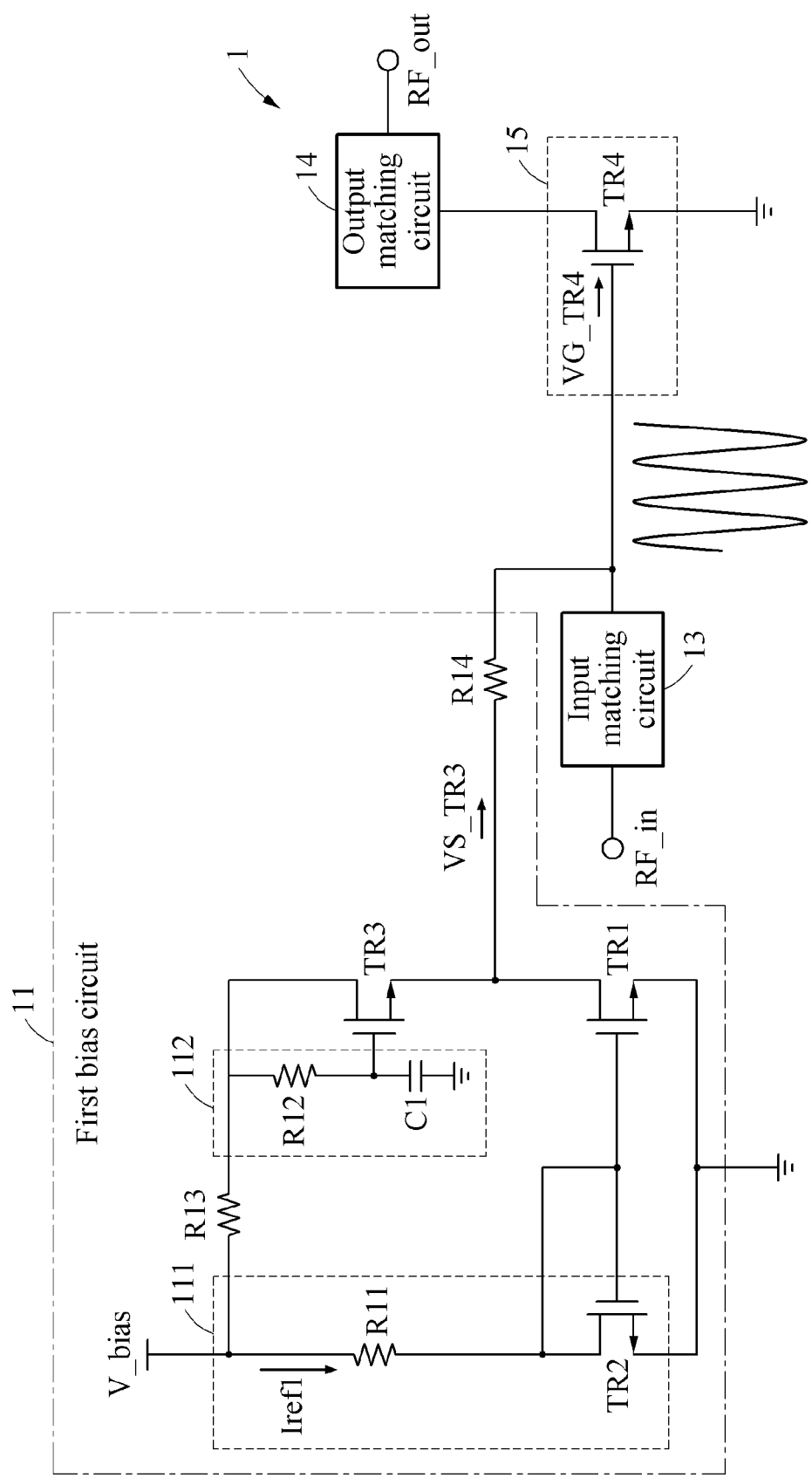
FIG. 1 illustrates an example of a power amplifier.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

A power amplifier (PA) that uses a field-effect transistor (FET) may improve power efficiency and linearity based on a bias circuit that operates in accordance with an input signal power. Improvements of the power efficiency and the linearity of the power amplifier may be secured by a bias circuit, for example a first bias circuit described below. A transistor included in the power amplifier described below may be a field-effect transistor, but is not limited thereto.

FIG. 1 illustrates an example of a power amplifier.

Referring to FIG. 1, a power amplifier 1 includes a first bias circuit 11, an input matching circuit 13, an amplifying circuit 15, and an output matching circuit 14. The amplifying circuit 15 includes a fourth transistor TR4.

The input matching circuit 13 is a circuit that matches an impedance of an input terminal RF_in and an input impedance of the fourth transistor TR4. For example, a first end of the input matching circuit 13 is connected to the input terminal RF_in and a second end of the input matching circuit 13 is connected to a gate terminal of the fourth transistor TR4 of the amplifying circuit 15.

The output matching circuit 14 is a circuit that matches an output impedance of the amplifying circuit 15 including the fourth transistor TR4 and an impedance of an external load connected to an output terminal RF_out. A first end of the output matching circuit 14 is connected to a drain terminal of the fourth transistor TR4, and a second end of the output matching circuit 14 is connected to the output terminal RF_out.

The fourth transistor TR4 is a transistor that is included in the amplifying circuit 15 of the power amplifier 1, and may be fabricated on, for example, an integrated circuit. The gate terminal of the fourth transistor TR4 connects to the second end of the input matching circuit 13 and the second end of a resistor, for example, a fourth resistance element R14 of the first bias circuit 11. The drain terminal of the fourth transistor TR4 is connected to the first end of the output matching circuit 14. A source terminal of the fourth transistor TR4 may be grounded. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The first bias circuit 11 is a circuit that supplies a bias to the fourth transistor TR4. The first bias circuit 11 may include a first transistor TR1, a second transistor TR2, a third transistor TR3, a first resistance element R11, a second resistance element R12, a third resistance element R13, and the fourth resistance element R14. The first transistor TR1, the second transistor TR2, and the third transistor TR3 may be field-effect transistors having a same polarity. In the examples, the polarity refers to a type of a transistor, for example, an n-type or a p-type.

In the first bias circuit 11, source terminals of the first transistor TR1 and the second transistor TR2 may be grounded. Gate terminals of the first transistor TR1 and the second transistor TR2 may be connected to each other. The gate terminal and a drain terminal of the second transistor TR2 may be connected. The drain terminal of the second transistor TR2 is connected to a first terminal of the first resistance element R11. A second terminal of the first resistance element R11 may be connected to a constant voltage terminal V_bias. Additionally, a drain terminal of the first transistor TR1 may be connected to a source terminal of the third transistor TR3. A drain terminal of the third transistor TR3 and a gate terminal of the third transistor TR3 may be connected via the second resistance element R12. The drain terminal of the third transistor TR3 may be connected to the constant voltage terminal V_bias via the third resistance element R13. Additionally, in the first bias circuit 11, the drain terminal of the first transistor TR1 may be connected to one terminal of the fourth resistance element R14.

The first bias circuit 11 may output a first signal VS_TR3 from the drain terminal of the first transistor TR1. Also, in the example of FIG. 1, the first transistor TR1 through the fourth transistor TR4 may each be an n-channel metal-oxide semiconductor (nMOS). In other words, the first transistor TR1 through the fourth transistor TR4 may have the same polarity and may each be, for example, an n-type transistor.

The amplifying circuit 15 amplifies an input signal power Pin based on a first bias signal VG_TR4 supplied from the first transistor TR1 to the fourth transistor TR4. For example, the gate terminal of the fourth transistor TR4 may be connected to the second terminal of the fourth resistance element R14. The first bias signal VG_TR4 is supplied to the gate terminal of the fourth transistor TR4 via the fourth resistance element R14, so that power amplification is performed on the input signal power Pin at a predetermined signal frequency. The first bias signal VG_TR4 may be a signal obtained after the first signal VS_TR3 passes the fourth resistance element R14.

Although FIG. 1 illustrates that the power amplifier 1 includes the first bias circuit 11 and the amplifying circuit 15, a configuration of the power amplifier 1 is not limited thereto. For example, a portion of the power amplifier 1 may be substituted, in an example, as follows.

In an example of the power amplifier 1 of FIG. 1, the power amplifier 1 may operate even without some or all of the resistance elements, for example, R11, R12, R13, and R14 of the first bias circuit 11.

Also, r the power amplifier 1 may operate regardless whether the power amplifier 1 includes a capacitor C1 connected to the second resistance element R12.

In the power amplifier 1, the second resistance element R12 and the capacitor C1 connected to the second resistance element R12 may be replaced with a general low-pass filter that filters, for example, removes, a signal frequency.

In the power amplifier 1, the first transistor TR1, the second transistor TR2, the third transistor TR3, and the fourth transistor TR4 may each be implemented as a transistor including three or more terminals instead of a metal-oxide-semiconductor field-effect transistor (MOSFET).

In the power amplifier 1, a first sub-bias circuit 111 including the second transistor TR2 and the first resistance element R11 may be replaced with a general bias circuit that supplies a gate voltage of the first transistor TR1.

As described above, the first bias circuit 11 of the power amplifier 1 may include the first transistor TR1 and the third transistor TR3 which have the same polarity, the first sub-bias circuit 111, and a low-pass filter 112. The amplifying circuit 15 may include the fourth transistor TR4 which has the same polarity as the first transistor TR1 and the third transistor TR3. In the first bias circuit 11, a second terminal of the first transistor TR1 and a second terminal of the first sub-bias circuit 111 may be grounded. A control terminal of the first transistor TR1 may be connected to a control terminal of the first sub-bias circuit 111. A first terminal of the first sub-bias circuit 111 may be connected to the constant voltage terminal V_bias. A first terminal of the first transistor TR1 may be connected to a second terminal of the third transistor TR3. A first terminal of the third transistor TR3 may be connected to an input terminal of the low-pass filter 112. An output terminal of the low-pass filter 112 may be connected to a control terminal of the third transistor TR3. The first terminal of the third transistor TR3 may be connected to the constant voltage terminal V_bias. The first bias circuit 11 may output the first signal VS_TR3 from the first terminal of the first transistor TR1. The first terminal of the first transistor TR1 may be connected to a control terminal of the fourth transistor TR4 in the amplifying circuit 15. In response to the first bias signal VG_TR4 being supplied to the control terminal of the fourth transistor TR4, the power amplifier 1 amplifies the input signal power Pin at a predetermined signal frequency.

The first sub-bias circuit 111 may include the second transistor TR2 and the first resistance element R11. The first terminal of the first sub-bias circuit 111 may include the second terminal of the first resistance element R11. A second terminal of the first sub-bias circuit 111 may include a second terminal of the second transistor TR2. The control terminal of the first sub-bias circuit 111 may include a control terminal of the second transistor TR2. The control terminal of the second transistor TR2 may be connected to a first terminal of the second transistor TR2. The first terminal of the second transistor TR2 is connected to one terminal of the first resistance element R11. The second terminal of the first resistance element R11 may be connected to the constant voltage terminal V_bias.

Additionally, the low-pass filter 112 may include the second resistance element R12 and the capacitor C1. The first terminal of the third transistor TR3 may be connected to the input terminal of the low-pass filter 112. The control terminal of the third transistor TR3 may be connected to the output terminal of the low-pass filter 112. One end of the capacitor C1 may be connected to the second resistance element R12, and may include the output terminal of the low-pass filter 112. A second end of the capacitor C1 may be grounded. The first terminal of the third transistor TR3 and the input terminal of the low-pass filter 112 may be connected to the constant voltage terminal V_bias via the third resistance element R13.

The first terminal of the first transistor TR1 may be connected to the control terminal of the fourth transistor TR4 via the fourth resistance element R14.

In one example, when each of the first transistor TR1 through the fourth transistor TR4 are a N-channel Field Effect Transistor (NFET), a first terminal of each of the transistors is a drain terminal, a control terminal of each of the transistors is a gate terminal, and a second terminal of each of the transistors may be a source terminal. In another example, when each of the first transistor TR1 through the fourth transistor TR4 is an NPN bipolar transistor, a first terminal of each of the transistors is a collector terminal, a control terminal of each of the transistors is a base terminal, and a second terminal of each of the transistors is an emitter terminal.

An operation of the power amplifier 1 having the circuit structure of FIG. 1 will be described as follows. For example, the operation of the power amplifier 1 may vary based on an intensity of input signal power. The intensity of input signal power may be classified as three state as follows.

In a state in which the input signal power Pin is not input to the input terminal RF_in, a first reference current Iref1 may be determined based on a value of a voltage applied to the constant voltage terminal V_bias in the first bias circuit 11, a resistance value of the first resistance element R11, a threshold, for example, a threshold voltage of the second transistor TR2, and a size. Additionally, because the second transistor TR2 and the first transistor TR1 are included in a current mirror circuit, if a drain voltage of the first transistor TR1 is in a saturation region, a current corresponding to an integer multiple of the first reference current Iref1 or the first reference current Iref1 may flow in the first transistor TR1. A current flowing in the third transistor TR3 may be the same as the current of the first transistor TR1. A source voltage of the third transistor TR3 is determined based on the current flowing in the third transistor TR3 and a gate-source voltage of the third transistor TR3. For example, the source voltage of the third transistor TR3 may be the same as the drain voltage of the first transistor TR1. A voltage of the first signal VS_TR3 may be the same as the source voltage of the third transistor TR3 and the drain voltage of the first transistor TR1. A gate voltage of the fourth transistor TR4 passes the fourth resistance element R14 to be the same as that of the first signal VS_TR3. A voltage of the first bias signal VG_TR4 is the same as the gate voltage of the fourth transistor TR4.

In addition, in a state in which the input signal power Pin is small, an average voltage of the first bias signal VG_TR4 is the same as a voltage obtained when the input signal power Pin is not input.

Also, in a state in which the input signal power Pin is large, an amplitude of a voltage of the first bias signal VG_TR4 increases. An amplitude of a voltage of the first signal VS_TR3 also increases through the fourth resistance element R14. In this example, if a lower limit amplitude voltage of the first signal VS_TR3 is in a triode region, for example, a non-saturation region, the average current of the first transistor TR1 may be smaller than an average current of the first transistor TR1 obtained when the input signal power Pin is absent or small. Since the current of the first transistor TR1 may be the same as the current of the third transistor TR3, as the current decreases, an average gate-source voltage of the third transistor TR3 decreases and an average voltage of the first signal VS_TR3 increases. In other words, as the input signal power Pin of the power amplifier 1 increases, an average gate voltage of the fourth transistor TR4 may increase. The voltage of the fourth transistor TR4 is the same as the voltage of the first bias signal VG_TR4.

A relationship with an average voltage applied to the gate terminal of the fourth transistor with respect to each magnitude of the input signal power will be described with reference to FIG. 2.

Figure 2:
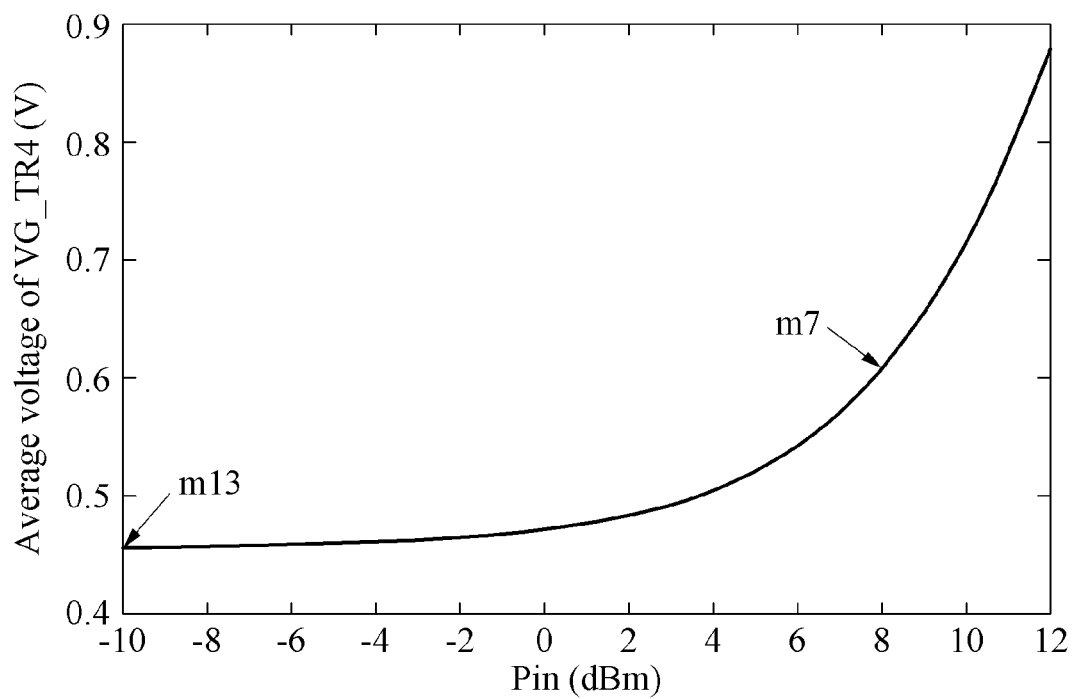
FIG. 2 illustrates an example of a relationship between an average voltage of VG_TR4 and an input power of the power amplifier of FIG. 1.

FIG. 2 illustrates an example of a relationship between an average voltage of VG_TR4 and an input power of the power amplifier of FIG. 1

FIG. 2 illustrates a circuit simulation result of the operation described with reference to FIG. 1. FIG. 2 illustrates a relationship between an input signal power Pin and an average voltage of VG_TR4 obtained when an input signal corresponding to a continuous wave of a predetermined signal frequency (for example, 28 gigahertz (GHz) as an input signal frequency) is input to the circuit of FIG. 1. The input signal power Pin corresponds to a horizontal axis and VG_TR4 corresponds to a vertical axis.

Referring to FIG. 2, the average voltage of VG_TR4 increases near a point at which the input signal power Pin is −2 dBm. Thus, the average voltage of VG_TR4 increases in an interval in which the input signal power Pin is large (for example, the input signal power Pin is greater than −2 dBm) when compared to an interval in which the input signal power Pin is absent or small (for example, an interval in which the input signal power Pin is less than −2 dBm).

Figure 3:
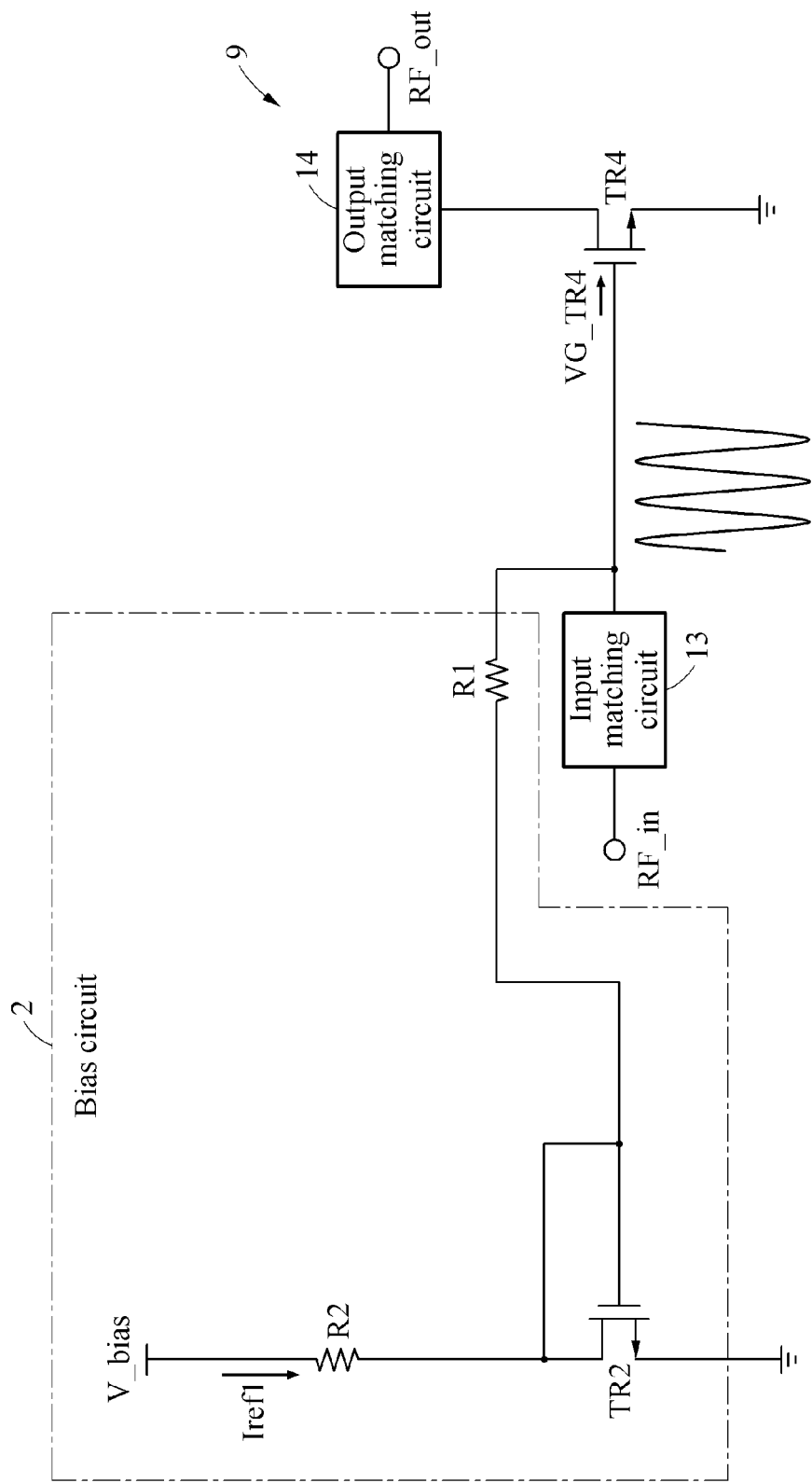
FIG. 3 illustrates an example of a current mirror circuit.

FIG. 3 illustrates an example of a current mirror circuit.

Referring to FIG. 3, in a current mirror circuit 9, a bias circuit 2 may only include the resistor R2 and the second transistor TR2. The current mirror circuit 9 may include the second transistor TR2 and the fourth transistor TR4 of the power amplifier 15 (FIG. 1).

In the first bias circuit 11 of FIG. 1 and the bias circuit 2 of FIG. 3, a model of a complementary metal-oxide-semiconductor (CMOS) FET having a gate length of 56 nanometers (nm) may be used as a transistor (each TR).

Figure 4:
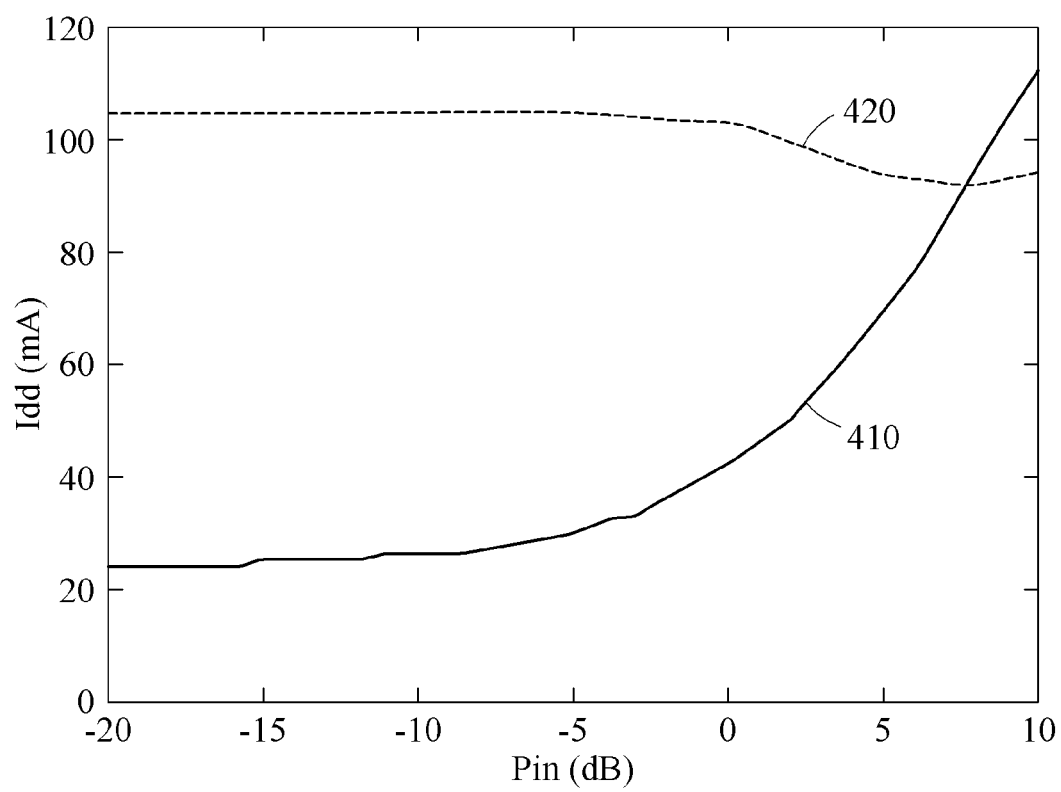
FIG. 4 illustrates an example of a graph that compares an input signal power and a consumed current in the power amplifier of FIG. 1 and the current mirror circuit of FIG. 3.

FIG. 4 illustrates an example of a graph that compares an input signal power and a consumed current in the power amplifier of FIG. 1 and the current mirror circuit of FIG. 3.

For example, a continuous wave having an input signal frequency of 28 GHz is input to the circuit illustrated in FIGS. 1 and 3. In FIG. 4, the input signal power Pin corresponds to a horizontal axis and a consumed current Idd of the fourth transistor TR4 corresponds to a vertical axis.

In the power amplifier 1 of FIG. 1, a consumed current 410 increases as the input signal power Pin increases. In the current mirror circuit 9 of FIG. 3, a consumed current 420 may be almost constant regardless of the input signal power Pin.

Figure 5:
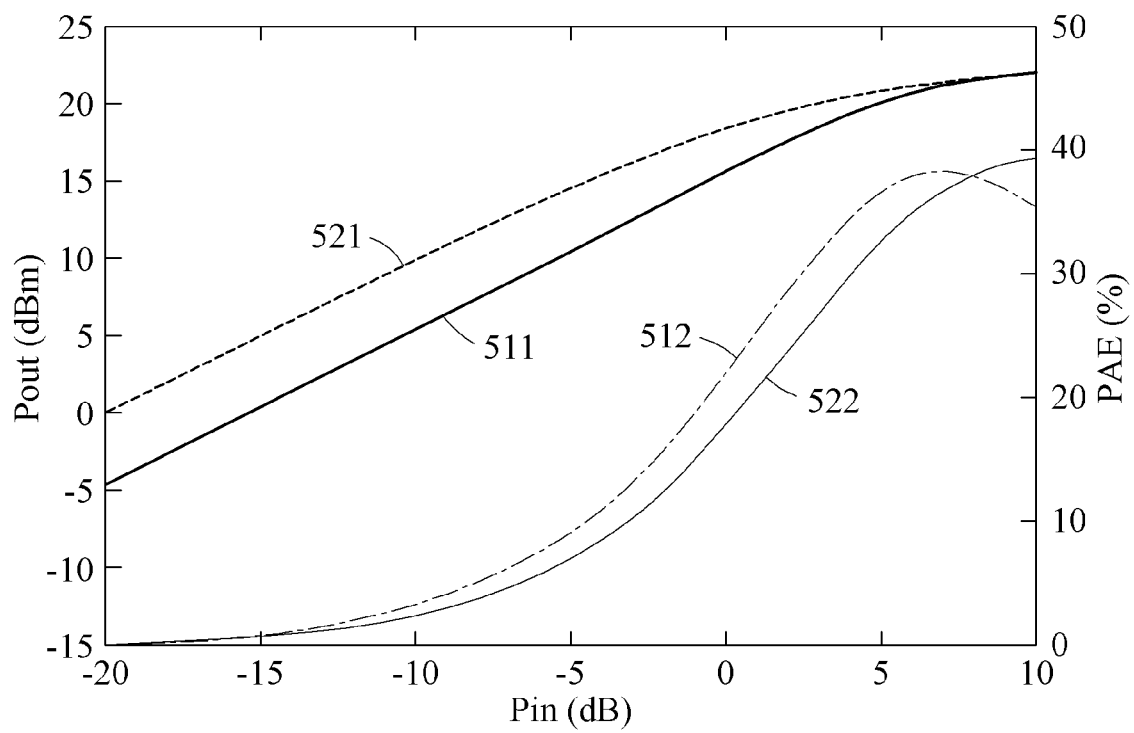
FIG. 5 illustrates an example of a graph that compares an output current Pout and a power-added efficiency (PAE) in the power amplifier of FIG. 1 and the current mirror circuit of FIG. 3.

FIG. 5 illustrates an example of a graph that compares an output current Pout and a power-added efficiency (PAE) in the power amplifier of FIG. 1 and the current mirror circuit of FIG. 3.

For example, a continuous wave having an input signal frequency of 28 GHz is input to the circuit illustrated in FIGS. 1 and 3. In FIG. 5, the input signal power Pin corresponds to a horizontal axis. The output current Pout corresponds to a left vertical axis. The PAE corresponds to a right vertical axis. The output current Pout may be a power of a signal output from the output terminal RF_out.

Referring to FIG. 5, an output power 511 of the power amplifier 1 of FIG. 1 and an output power 521 of the current mirror circuit 9 of FIG. 3 are saturated when the input signal power Pin increases. Until the output power 511 and 521 are approximately saturated, for example, until the input signal power Pin reaches about 5 dBm, a PAE 512 of the power amplifier 1 of FIG. 1 may be higher than a PAE 522 of the current mirror circuit 9. This is because the consumed current 410 of the power amplifier 1 of FIG. 1 varies based on the input signal power Pin as illustrated in FIG. 4.

Figure 6:
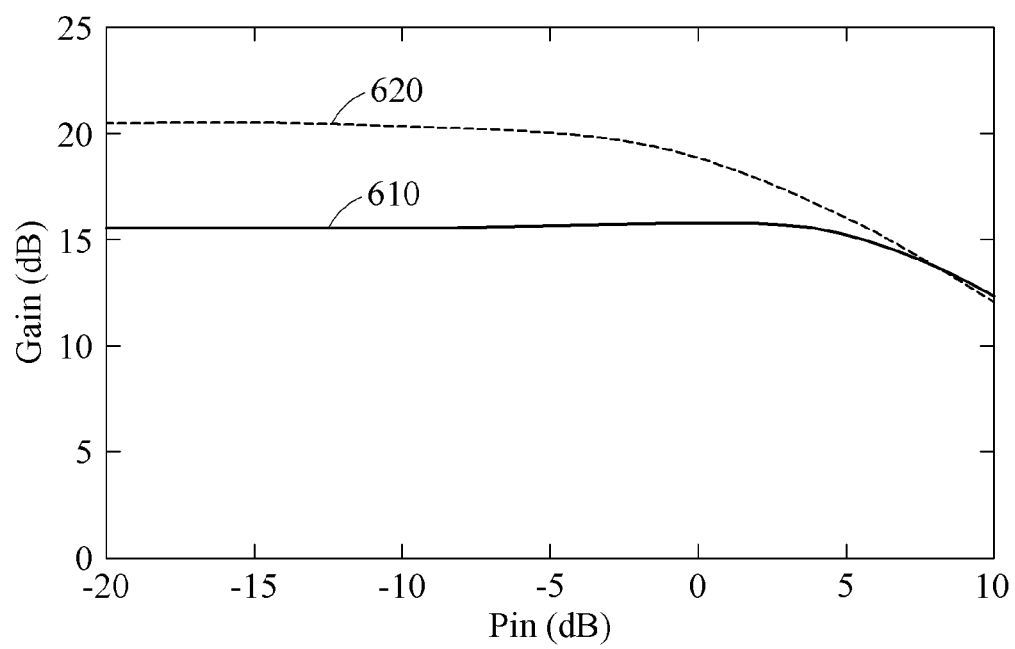
FIG. 6 illustrates an example of a graph that compares gains of the power amplifier of FIG. 1 and the current mirror circuit of FIG. 3.

FIG. 6 illustrates an example of a graph that compares gains of the power amplifier of FIG. 1 and the current mirror circuit of FIG. 3.

For example, a continuous wave having an input signal frequency of 28 GHz may be input to the circuit illustrated in FIGS. 1 and 3. Referring to FIG. 6, the input signal power Pin corresponds to a horizontal axis and a gain of circuit corresponds to a vertical axis.

A gain 610 of the power amplifier 1 is almost constant until an output is approximately saturated (for example, to be Pin to 5 decibel-milliwatts (dBm)). A gain of the current mirror circuit 9 of FIG. 3 varies greatly. In the power amplifier 1 of FIG. 1, VG_TR4 moves to a higher level while changing in response to the input signal power Pin, so that the power amplifier 1 minimizes distortion and achieves a high linearity.

As described with reference to FIGS. 2 and 4 through 6, the power amplifier 1 of FIG. 1 may achieve an improved power efficiency and a high linearity.

Figure 7:
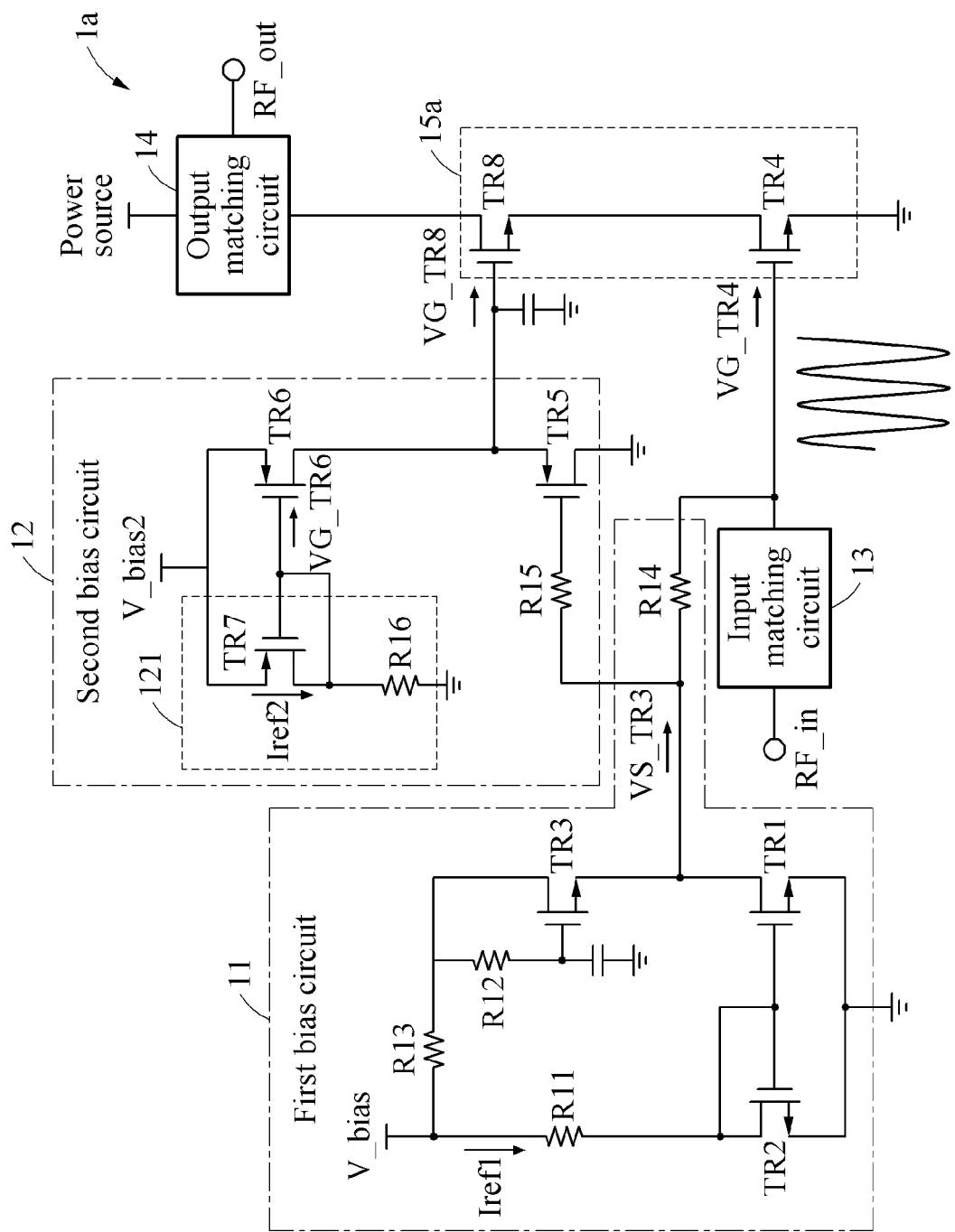
FIG. 7 illustrates an example of a power amplifier.

FIG. 7 illustrates an example of a power amplifier.

Referring to FIG. 7, a power amplifier 1a may include a first bias circuit 11, a second bias circuit 12, an input matching circuit 13, an amplifying circuit 15a, and an output matching circuit 14. In the example of FIG. 7, the amplifying circuit 15a may include a fourth transistor TR4 and an eighth transistor TR8. In FIG. 7, the same parts as those of the power amplifier 1 shown in FIG. 1 are denoted by the same reference numerals, and a description thereof will be omitted.

Wireless applications utilize technology for transmitting wireless signals and power over long distances. Thus, a power amplification technique for further increasing an output power is desired. One way to amplify the output power is to increase a voltage of a power source. In this example, the output power may not be increased above a threshold voltage capability of a transistor. In the example of FIG. 7, in the power amplifier 1a, the eighth transistor TR8 is vertically stacked with respect to the fourth transistor TR4. In such a vertically stacked structure, a bias and an amplitude voltage applied to one transistor may be divided in half operationally in the power amplifier 1a.

In the example of FIG. 7, as a bias circuit for the eighth transistor TR8, the second bias circuit 12 may additionally be installed. The second bias circuit 12 includes a fifth transistor TR5, a sixth transistor TR6, a seventh transistor TR7, a fifth resistance element R15, and a sixth resistance element R16. The fifth transistor TR5, the sixth transistor TR6, and the seventh transistor TR7 may each be an FET having a different polarity from the polarity of the first transistor TR1, the second transistor TR2, and the third transistor TR3 described with reference to FIG. 1.

The eighth transistor TR8 of the amplifying circuit 15a includes an FET having the same polarity as the fourth transistor TR4. A source terminal of the eighth transistor TR8 may be connected in series to the drain terminal of the fourth transistor TR4.

In the second bias circuit 12, a source terminal of the sixth transistor TR6 and a source terminal of the seventh transistor TR7 may be connected to a second constant terminal V_bias2. Gate terminals of the sixth transistor TR6 and the seventh transistor TR7 may be connected to each other. The gate terminal and a drain terminal of the seventh transistor TR7 may be connected to each other. The drain terminal of the seventh transistor TR7 may be connected to a first terminal of the sixth resistance element R16. A second terminal of the sixth resistance element R16 may be grounded. Additionally, in the second bias circuit 12, a drain terminal of the fifth transistor TR5 may be grounded. The drain terminal of the first transistor TR1 may be connected to a first terminal of the fifth resistance element R15. A second terminal of the fifth resistance element R15 may be connected to a gate terminal of the fifth transistor TR5. A drain terminal of the sixth transistor TR6 and a source terminal of the fifth transistor TR5 may be connected. A drain terminal of the fifth transistor TR5 may be grounded.

The second bias circuit 12 supplies a second bias signal VG_TR8 to the eighth transistor TR8. For example, the second bias circuit 12 may output the second bias signal VG_TR8 from the source terminal of the fifth transistor TR5 to a gate terminal of the eighth transistor TR8. Additionally, in the example of FIG. 7, the fifth transistor TR5 through the seventh transistor TR7 may each be a p-channel metal-oxide semiconductor (pMOS). In other words, the fifth transistor TR5 through the seventh transistor TR7 may have a different polarity from the polarity of the first transistor TR1 through the fourth transistor TR4 and may each be, for example, a p-type transistor.

The configuration of the power amplifier 1a of FIG. 7 is not limited thereto. For example, a portion of the power amplifier 1a may be substituted as follows.

In an example, the power amplifier 1a of FIG. 7 may operate without some or all of the resistance elements, for example, R15 and R16 of the second bias circuit 12.

Additionally, in an example, in the power amplifier 1a, the fifth transistor TR5, the sixth transistor TR6, the seventh transistor TR7, and the eighth transistor TR8 may each be implemented as a transistor including three or more terminals instead of a MOSFET.

In the power amplifier 1a, a second sub-bias circuit 121 including the seventh transistor TR7 and the sixth resistance element R16 may be replaced with a general bias circuit that supplies a gate voltage of the sixth transistor TR6.

As described above, the second bias circuit 12 of the power amplifier 1a includes the second sub-bias circuit 121, the fifth transistor TR5 and the sixth transistor TR6 having a different polarity from the polarity of the first transistor TR1 and the third transistor TR3.

The amplifying circuit 15a includes the fourth transistor TR4 and the eighth transistor TR8 having the same polarity as the fourth transistor TR4. A second terminal of the eighth transistor TR8 is connected to a first terminal of the fourth transistor TR4.

In the second bias circuit 12, a first terminal of the second sub-bias circuit 121 and a first terminal of the sixth transistor TR6 may be connected to the second constant terminal V_bias2. A control terminal of the sixth transistor TR6 and a control terminal of the second sub-bias circuit 121 may be connected. A second terminal of the second sub-bias circuit 121 is grounded. A second terminal of the fifth transistor TR5 may be grounded. The first terminal of the first transistor TR1 may be connected to a control terminal of the fifth transistor TR5. A second terminal of the sixth transistor TR6 and a first terminal of the fifth transistor TR5 may be connected. The second terminal of the fifth transistor TR5 may be grounded.

The power amplifier 1a outputs the second bias signal VG_TR8 from the first terminal of the fifth transistor TR5 to the control terminal of the eighth transistor TR8.

The second sub-bias circuit 121 includes the seventh transistor TR7 and the sixth resistance element R16. The first terminal of the second sub-bias circuit 121 may include a first terminal of the seventh transistor TR7. The second terminal of the second sub-bias circuit 121 may include a second terminal of the sixth resistance element R16. The control terminal of the second sub-bias circuit 121 may include a control terminal of the seventh transistor TR7. The control terminal of the seventh transistor TR7 and a second terminal of the seventh transistor TR7 may be connected. The second terminal of the seventh transistor TR7 may be connected to a first terminal of the sixth resistance element R16. The second terminal of the sixth resistance element R16 may be grounded.

Additionally, the first terminal of the first transistor TR1 may be connected to the control terminal of the fifth transistor TR5 via the fifth resistance element R15.

When each of the fifth transistor TR5 through the seventh transistor TR7 is a P-channel Field Effect Transistor (PFET), the first terminal of each of the transistors may be a source terminal, the control terminal of each of the transistors may be a gate terminal, and the second terminal of each of the transistors may be a drain terminal. When each of the fifth transistor TR5 through the seventh transistor TR7 is a PNP bipolar transistor, the first terminal of each of the transistors is an emitter terminal, the control terminal of each of the transistors is a base terminal, and the second terminal of each of the transistors is a collector terminal.

When the eighth transistor TR8 is an NFET, a first terminal of the eighth transistor TR8 may be a drain terminal, a control terminal of the eighth transistor TR8 may be a gate terminal, and a second terminal of the eighth transistor TR8 may be a source terminal. When the eighth transistor TR8 is an NPN bipolar transistor, a first terminal of the eighth transistor TR8 may be a collector terminal, a control terminal of the eighth transistor TR8 may be a base terminal, and a second terminal of the eighth transistor TR8 may be an emitter terminal.

An operation of the power amplifier 1a of FIG. 7 will be described as follows. For example, the operation of the power amplifier 1a may vary based on an intensity of input signal power. The intensity of input signal power may be classified as three state as follows.

In a state in which the input signal power Pin is not input to the input terminal RF_in, a bias voltage applied to the fourth transistor TR4 is the same as described in the example of FIG. 1. In the second bias circuit 12, a value of a second reference current Iref2 and a voltage value VG_TR6 are determined based on voltage values of the seventh transistor TR7, the sixth resistance element R16, and the second constant terminal V_bias2. Since the seventh transistor TR7 and the sixth transistor TR6 may be included in a current mirror circuit, a current corresponding to an integer multiple of the second reference current Iref2, or the second reference current Iref2 flows in the sixth transistor TR6 and the fifth transistor TR5. Additionally, the gate voltage of the fifth transistor TR5 is given by the first signal VS_TR3 transferred from the first bias circuit 11. The second bias signal VG_TR8 is a bias voltage applied to the gate terminal of the eighth transistor TR8, and may be determined based on the current flowing in the fifth transistor TR5 and a gate-source voltage of the fifth transistor TR5 which is a p-channel metal-oxide semiconductor (PMOS). For example, the voltage of the first signal VS_TR3 may be applied to the gate terminal of the fifth transistor TR5, and the voltage of the second bias signal VG_TR8 may be applied to the source terminal of the fifth transistor TR5.

In addition, in a state in which the input signal power Pin is small, an average voltage of the fourth transistor TR4 in the first bias circuit 11, and an average voltage of the eighth transistor TR8 may be the same as a voltage obtained when the input signal power Pin is not input.

Additionally, as described in the example of FIG. 1, in a state in which the input signal power Pin is large, an amplitude of a voltage of the first bias signal VG_TR4 increases, so that an amplitude of a voltage of the first signal VS_TR3 increases through the fourth resistance element R14. In this example, if a lower limit amplitude voltage of the first signal VS_TR3 is in a triode region, for example, a non-saturation region of the first transistor TR1, the average current of the first transistor TR1 may be smaller than an average current of the first transistor TR1 obtained when the input signal power Pin is absent or small. Because the current of the first transistor TR1 is the same as the current of the third transistor TR3, as the current decreases, an average gate-source voltage of the third transistor TR3 decreases and an average voltage of the first signal VS_TR3 increases. Also, in the second bias circuit 12, the voltage of the first signal VS_TR3 which is the gate voltage of the fifth transistor TR5 increases. However, the current flowing in the fifth transistor TR5 is constant. Thus, the voltage of the second bias signal VG_TR8 which is a source voltage of the fifth transistor TR5 increases. As such, when the input signal power Pin increases in the power amplifier 1a, the voltage of the first bias signal VG_TR4 which is the gate voltage of the fourth transistor TR4 and the voltage of the second bias signal VG_TR8 which is the gate voltage of the eighth transistor TR8 increase.

As described with reference to FIG. 1, in the example of FIG. 7, on the basis of an increase of the input signal power Pin of the power amplifier 1a, in addition to a bias voltage of a transistor of which a source is grounded (for example, a voltage of a bias signal) increasing, a gate voltage of a transistor in a vertically stacked structure (for example, a voltage of a second bias signal) may also increase. Therefore, an improvement in power efficiency and linearity may be secured for a power amplifier PA 1a which has a vertically stacked structure.

Figure 8:
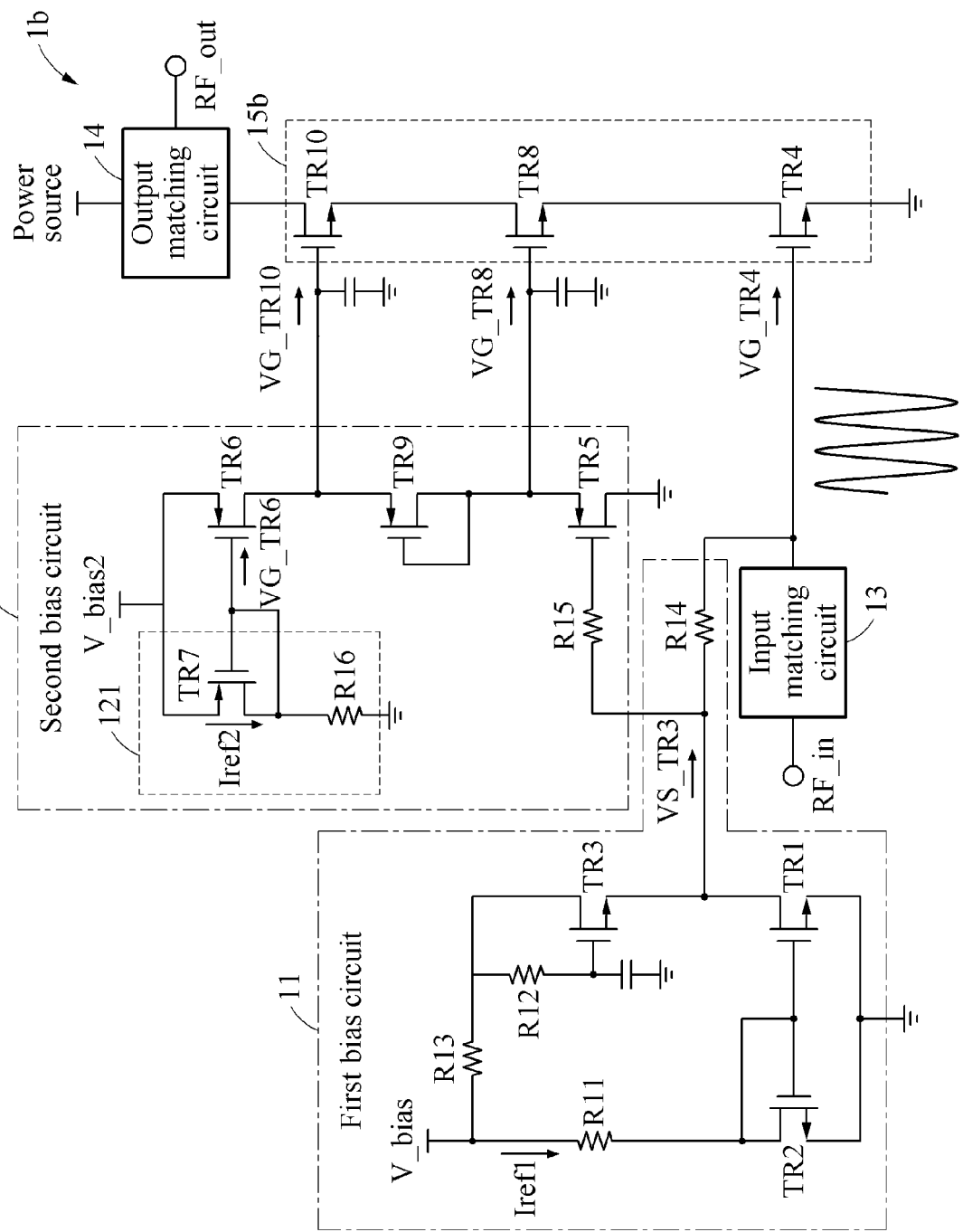
FIG. 8 illustrates an example of a power amplifier.

FIG. 8 illustrates an example of a power amplifier 1b.

Referring to FIG. 8, a power amplifier 1b may include a first bias circuit 11, a second bias circuit 12a, an input matching circuit 13, an amplifying circuit 15b, and an output matching circuit 14.

In the example of FIG. 8, the amplifying circuit 15b may include a fourth transistor TR4, an eighth transistor TR8, and a tenth transistor TR10. In FIG. 8, the same parts as those of the power amplifier 1 shown in FIG. 1 and the power amplifier 1a shown in FIG. 7 are denoted by the same reference numerals, and a description thereof will be omitted.

The power amplifier 1b of FIG. 8 may further include a vertically stacked transistor in comparison to the power amplifier 1a of FIG. 7. For example, the tenth transistor TR10 may be added as a transistor in a vertically stacked structure, and a ninth transistor TR9 diode-connected in the second bias circuit 12a may be added. When compared to the second bias circuit 12 of FIG. 7, the second bias circuit 12a of FIG. 8 may further include a field-effect transistor as the ninth transistor TR9 which has the same polarity as the fifth transistor TR5, the sixth transistor TR6, and the seventh transistor TR7.

In the examples, a diode-connected transistor may be a transistor configured to operate as a diode. For example, in a p-type transistor, a gate terminal and a drain terminal of the p-type transistor may be connected to each other.

Additionally, the amplifying circuit 15b of FIG. 8 may further include the tenth transistor TR10 when compared to the amplifying circuit 15a of FIG. 7. The tenth transistor TR10 may be a field-effect transistor which has the same polarity as the eighth transistor TR8. A source terminal of the tenth transistor TR10 may be connected in series to a drain terminal of the eighth transistor TR8.

In the second bias circuit 12a, a drain terminal of the sixth transistor TR6 may be connected to a source terminal of the ninth transistor TR9. A gate terminal and a drain terminal of the ninth transistor TR9 may be connected to each other. The drain terminal of the ninth transistor TR9 may be connected to the source terminal of the fifth transistor TR5.

In the above configuration, the second bias circuit 12a outputs a third bias signal VG_TR10 from the source terminal of the ninth transistor TR9 to the tenth transistor TR10. Additionally, in the example of FIG. 8, the ninth transistor TR9 is a pMOS. The ninth transistor TR9 may be a p-type FET having a different polarity from the polarity of the first transistor TR1 through the fourth transistor TR4, and having the same polarity as the fifth transistor TR5 and the seventh transistor TR7.

The configuration of the power amplifier 1b of FIG. 8 is not limited thereto. For example, a portion of the power amplifier 1b may be substituted as follows.

The power amplifier 1b may include an amplifying circuit in which an FET corresponding to n tenth transistors TR10 having gate terminals receiving n outputs of n diode-connected ninth transistors TR9 and a bias circuit having the n diode-connected ninth transistors TR9 are vertically stacked, n being an integer greater than or equal to 2. For example, if n=2, an additional ninth transistor TR9a having a gate terminal connected to a drain terminal may be connected between the drain terminal of the sixth transistor TR6 and the source terminal of the ninth transistor TR9 in a bias circuit. Also, in an amplifying circuit, an additional tenth transistor TR10a may be connected between the drain terminal of the tenth transistor TR10 and the output matching circuit 14. Through this, a gate terminal of the additional tenth transistor TR10a and a source terminal of the additional ninth transistor TR9a are connected.

In the power amplifier 1b of FIG. 8, the ninth transistor TR9 and the tenth transistor TR10 may each be implemented as a transistor including three or more terminals instead of a MOSFET.

As described above, the second bias circuit 12a of the power amplifier 1b may include the ninth transistor TR9 which has the same polarity as the fifth transistor TR5 and the sixth transistor TR6.

The amplifying circuit 15b may include the tenth transistor TR10 which has the same polarity as the fourth transistor TR4, and the eighth transistor TR8. A second terminal of the tenth transistor TR10 is connected in series to a first terminal of the eighth transistor TR8.

In the second bias circuit 12a, a second terminal of the sixth transistor TR6 may be connected to a first terminal of the ninth transistor TR9. A control terminal of the ninth transistor TR9 may be connected to a second terminal of the ninth transistor TR9. The second terminal of the ninth transistor TR9 and a first terminal of the fifth transistor TR5 may be connected.

The power amplifier 1b outputs the third bias signal VG_TR10 from the first terminal of the ninth transistor TR9 to a control terminal of the tenth transistor TR10.

When the ninth transistor TR9 is a PFET, the first terminal of the ninth transistor TR9 is a source terminal, the control terminal of the ninth transistor TR9 is a gate terminal, and the second terminal of the ninth transistor TR9 is a drain terminal. When the ninth transistor TR9 is a PNP bipolar transistor, the first terminal of the ninth transistor TR9 is an emitter terminal, the control terminal of the ninth transistor TR9 is a base terminal, and the second terminal of the ninth transistor TR9 is a collector terminal.

Additionally, when the tenth transistor TR10 is an NFET, the first terminal of the tenth transistor TR10 is a drain terminal, the control terminal of the tenth transistor TR10 is a gate terminal, and the second terminal of the tenth transistor TR10 is a source terminal. When the tenth transistor TR10 is an NPN bipolar transistor, the first terminal of the tenth transistor TR10 is a collector terminal, the control terminal of the tenth transistor TR10 is a base terminal, and the second terminal of the tenth transistor TR10 is an emitter terminal.

An operation of the power amplifier 1b having the configuration described with reference to FIG. 8 may be the same as an operation of the power amplifier 1a of FIG. 7, except for the additional portion. When an input voltage of the input signal power Pin increases, a voltage of the second bias signal VG_TR8 increases, so that a voltage of the third bias signal VG_TR10 which is a gate voltage of the tenth transistor TR10 increases through the operation of the diode-connected ninth transistor TR9.

As described above, similar to the examples of the power amplifiers 1 and 1a of FIGS. 1 and 7, when the input signal power Pin of the power amplifier 1b of FIG. 8 increases, in addition to a bias voltage of a transistor of which a source is grounded (for example, a voltage of a bias signal) increasing, gate voltages of a plurality of vertically stacked transistors (for example, voltages of a second bias signal and a third bias signal) may also increase simultaneously. Therefore, an improvement in power efficiency and linearity may be secured for the power amplifier 1b having a vertically stacked structure.

Figure 9:
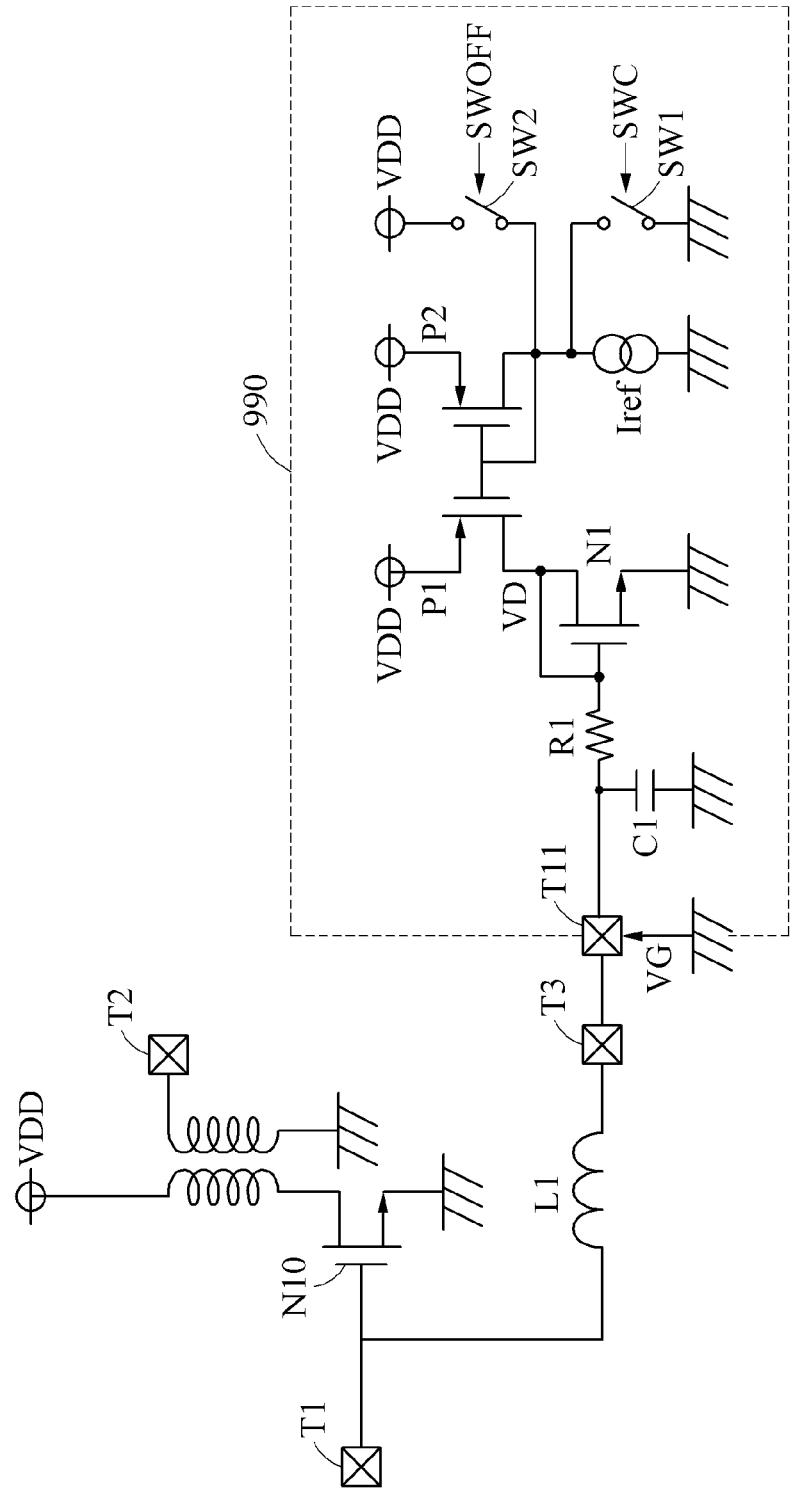
FIG. 9 illustrates an example of a current mirror circuit.

FIG. 9 illustrates an example of a current mirror circuit.

A bias circuit of a power amplifier with an FET is implemented as, for example, a current mirror circuit as illustrated in FIG. 9. In FIG. 9, a bias circuit 990 supplies a bias voltage VG to a transistor N10 for power amplification. In the bias circuit 990, a constant current Iref flows to a transistor P2. Additionally, in a current mirror circuit including a transistor P1 and the transistor P2, a current of the constant current Iref flows to the transistor P1 and a transistor N1.

In the example of FIG. 9, because the transistor N1 and the transistor N10 are included in a current mirror circuit, a current having the same magnitude as the current flowing in the transistor N1 may flow in the transistor N10. Through such operation, a bias current or a bias voltage may be applied to the transistor N10, so that the circuit of FIG. 9 performs an amplifying operation as a power amplifier.

However, since an average value of the voltage VG applied to a gate of the transistor N10 becomes a fixed voltage independently of a power input from a terminal T1, the circuit of FIG. 9 may not be optimized for input power in terms of power efficiency and linearity.

In contrast, in the power amplifiers 1, 1a, and 1b described with reference to FIGS. 1 through 8, as the input signal power Pin increases, average gate voltages of the amplifying circuits 15, 15a, and 15b may also increase through a bias circuit operating in accordance with the input signal power Pin, so that power efficiency and linearity of the power amplifiers 1, 1a, and 1b may be improved.

The power amplifiers 1, 1a, and 1b described with reference to FIGS. 1 through 9, and that perform operations described in this application are implemented as and by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods of FIG. 1-9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier, comprising:
a first bias circuit comprising a first transistor, a third transistor, and a first sub-bias circuit; and
an amplifying circuit comprising a fourth transistor,
wherein, in the first bias circuit, a second terminal of the first transistor and a second terminal of the first sub-bias circuit are grounded, a control terminal of the first transistor is connected to a control terminal of the first sub-bias circuit, a first terminal of the first sub-bias circuit is connected to a constant voltage terminal, a first terminal of the first transistor is connected to a second terminal of the third transistor, a first terminal of the third transistor is connected to a control terminal of the third transistor, and the first terminal of the third transistor is connected to the constant voltage terminal,
wherein the amplifying circuit is configured to amplify an input signal power based on a first bias signal supplied from the first bias circuit to a control terminal of the fourth transistor, and
wherein the first terminal of the third transistor and the control terminal of the third transistor are connected via a second resistance element.

2. The power amplifier of claim 1, wherein the first transistor is configured to have a same polarity as the third transistor, and the fourth transistor is configured to have a same polarity as the first transistor and the third transistor.

3. The power amplifier of claim 1, wherein the first bias circuit is configured to output a bias signal from the first terminal of the first transistor, and
in the amplifying circuit, the control terminal of the fourth transistor is connected to the first terminal of the first transistor.

4. The power amplifier of claim 1, wherein the first sub-bias circuit comprises a second transistor comprising a first terminal and a second terminal, and a first resistance element comprising a first terminal and a second terminal,
the first terminal of the first sub-bias circuit is comprised of the second terminal of the first resistance element, and
the second terminal of the first sub-bias circuit is comprised of the second terminal of the second transistor.

5. The power amplifier of claim 4, wherein a control terminal of the second transistor is connected to the first terminal of the second transistor,
the first terminal of the second transistor is connected to the first terminal of the first resistance element, and
the second terminal of the first resistance element is connected to the constant voltage terminal.

6. The power amplifier of claim 1, wherein the first bias circuit further comprises a low-pass filter,
the first terminal of the third transistor is connected to an input terminal of the low-pass filter, and
an output terminal of the low-pass filter is connected to the control terminal of the third transistor.

7. The power amplifier of claim 6, wherein the first terminal of the third transistor and the input terminal of the low-pass filter are connected to the constant voltage terminal via a third resistance element.

8. The power amplifier of claim 1, wherein the first terminal of the first transistor is connected to a control terminal of the fourth transistor via a fourth resistance element.

9. The power amplifier of claim 2, further comprising:
a second bias circuit comprising a fifth transistor and a sixth transistor, each of the fifth transistor and the sixth transistor having a different polarity from the polarity of the first transistor and the polarity of the third transistor; and
a second sub-bias circuit,
wherein the amplifying circuit further comprises:
an eighth transistor connected in series with the fourth transistor, the eighth transistor having which has the same polarity as the fourth transistor, and the eighth transistor is configured to receive a second bias signal from the fifth transistor.

10. The power amplifier of claim 9, wherein, in the amplifying circuit, a second terminal of the eighth transistor is connected to a first terminal of the fourth transistor,
wherein, in the second bias circuit, a first terminal of the second sub-bias circuit and a first terminal of the sixth transistor are connected to a second constant voltage terminal, a control terminal of the sixth transistor is connected to a control terminal of the second sub-bias circuit, a second terminal of the second sub-bias circuit is grounded, a second terminal of the fifth transistor is grounded, the first terminal of the first transistor is connected to a control terminal of the fifth transistor, and the second terminal of the sixth transistor is connected to a first terminal of the fifth transistor, and
wherein the second bias circuit is configured to output the second bias signal from the first terminal of the fifth transistor to a control terminal of the eighth transistor.

11. The power amplifier of claim 9, wherein the second sub-bias circuit comprises a seventh transistor and a sixth resistance element,
the first terminal of the second sub-bias circuit is comprised of a first terminal of the seventh transistor,
the second terminal of the second sub-bias circuit is comprised of a second terminal of the sixth resistance element, a control terminal of the seventh transistor is connected to a second terminal of the seventh transistor, and
the second terminal of the seventh transistor is connected to a first terminal of the sixth resistance element.

12. The power amplifier of claim 9, wherein the first terminal of the first transistor is connected to the control terminal of the fifth transistor via a fifth resistance element.

13. The power amplifier of claim 9, wherein the second bias circuit further comprises a ninth transistor which has a same polarity as the fifth transistor and a same polarity as the sixth transistor, and
the amplifying circuit further comprises a tenth transistor connected in series with the eighth transistor, the tenth transistor having a same polarity as the eighth transistor, and the tenth transistor is configured to receive a third bias signal from the ninth transistor.

14. The power amplifier of claim 9, wherein, in the amplifying circuit, a second terminal of the tenth transistor is connected in series with a first terminal of the eighth transistor,
in the second bias circuit, a second terminal of the sixth transistor is connected to a first terminal of the ninth transistor,
a control terminal of the ninth transistor is connected to a second terminal of the ninth transistor,
the second terminal of the ninth transistor is connected to a first terminal of the fifth transistor, and
the second bias circuit is configured to output the third bias signal from the first terminal of the ninth transistor to a control terminal of the tenth transistor.

15. The power amplifier of claim 6, wherein the low-pass filter comprises a second resistance element and a capacitor,
a first end of the capacitor is connected to the output terminal of the low-pass filter, and
a second end of the capacitor is grounded.

16. A power amplifier, comprising:
a first bias circuit comprising a first transistor, a third transistor, and a first sub-bias circuit; and
an amplifying circuit comprising a fourth transistor,
wherein, in the first bias circuit, a second terminal of the first transistor and a second terminal of the first sub-bias circuit are grounded, a control terminal of the first transistor is connected to a control terminal of the first sub-bias circuit, a first terminal of the first sub-bias circuit is connected to a constant voltage terminal, a first terminal of the first transistor is connected to a second terminal of the third transistor, a first terminal of the third transistor is connected to a control terminal of the third transistor, and the first terminal of the third transistor is connected to the constant voltage terminal,
wherein the amplifying circuit is configured to amplify an input signal power based on a first bias signal supplied from the first bias circuit to a control terminal of the fourth transistor,
wherein the first bias circuit further comprises a low-pass filter,
the first terminal of the third transistor is connected to an input terminal of the low-pass filter, and
an output terminal of the low-pass filter is connected to the control terminal of the third transistor, and
wherein the low-pass filter comprises a second resistance element and a capacitor,
a first end of the capacitor is connected to the output terminal of the low-pass filter, and
a second end of the capacitor is grounded.

17. A power amplifier, comprising:
a first bias circuit comprising a first transistor, a third transistor, and a first sub-bias circuit; and
an amplifying circuit comprising a fourth transistor,
wherein, in the first bias circuit, a second terminal of the first transistor and a second terminal of the first sub-bias circuit are grounded, a control terminal of the first transistor is connected to a control terminal of the first sub-bias circuit, a first terminal of the first sub-bias circuit is connected to a constant voltage terminal, a first terminal of the first transistor is connected to a second terminal of the third transistor, a first terminal of the third transistor is connected to a control terminal of the third transistor, and the first terminal of the third transistor is connected to the constant voltage terminal,
wherein the amplifying circuit is configured to amplify an input signal power based on a first bias signal supplied from the first bias circuit to a control terminal of the fourth transistor,
wherein the first transistor is configured to have a same polarity as the third transistor, and the fourth transistor is configured to have a same polarity as the first transistor and the third transistor, and
wherein the power amplifier further comprises:
a second bias circuit comprising a fifth transistor and a sixth transistor, each of the fifth transistor and the sixth transistor having a different polarity from the polarity of the first transistor and the polarity of the third transistor; and
a second sub-bias circuit,
wherein the amplifying circuit further comprises:
an eighth transistor connected in series with the fourth transistor, the eighth transistor having which has the same polarity as the fourth transistor, and the eighth transistor is configured to receive a second bias signal from the fifth transistor.

18. The power amplifier of claim 17, wherein, in the amplifying circuit, a second terminal of the eighth transistor is connected to a first terminal of the fourth transistor,
wherein, in the second bias circuit, a first terminal of the second sub-bias circuit and a first terminal of the sixth transistor are connected to a second constant voltage terminal, a control terminal of the sixth transistor is connected to a control terminal of the second sub-bias circuit, a second terminal of the second sub-bias circuit is grounded, a second terminal of the fifth transistor is grounded, the first terminal of the first transistor is connected to a control terminal of the fifth transistor, and the second terminal of the sixth transistor is connected to a first terminal of the fifth transistor, and
wherein the second bias circuit is configured to output the second bias signal from the first terminal of the fifth transistor to a control terminal of the eighth transistor.

19. The power amplifier of claim 17, wherein the second sub-bias circuit comprises a seventh transistor and a sixth resistance element,
the first terminal of the second sub-bias circuit is comprised of a first terminal of the seventh transistor,
the second terminal of the second sub-bias circuit is comprised of a second terminal of the sixth resistance element,
a control terminal of the seventh transistor is connected to a second terminal of the seventh transistor, and
the second terminal of the seventh transistor is connected to a first terminal of the sixth resistance element.

20. The power amplifier of claim 17, wherein the first terminal of the first transistor is connected to the control terminal of the fifth transistor via a fifth resistance element.

21. The power amplifier of claim 17, wherein the second bias circuit further comprises a ninth transistor which has a same polarity as the fifth transistor and a same polarity as the sixth transistor, and
- the amplifying circuit further comprises a tenth transistor connected in series with the eighth transistor, the tenth transistor having a same polarity as the eighth transistor, and the tenth transistor is configured to receive a third bias signal from the ninth transistor.

22. The power amplifier of claim 21, wherein, in the amplifying circuit, a second terminal of the tenth transistor is connected in series with a first terminal of the eighth transistor,
- in the second bias circuit, a second terminal of the sixth transistor is connected to a first terminal of the ninth transistor,
- a control terminal of the ninth transistor is connected to a second terminal of the ninth transistor,
- the second terminal of the ninth transistor is connected to a first terminal of the fifth transistor, and
- the second bias circuit is configured to output the third bias signal from the first terminal of the ninth transistor to a control terminal of the tenth transistor.

* * * * *